United States Patent
DeMuynck et al.

(10) Patent No.: US 7,384,878 B2
(45) Date of Patent: Jun. 10, 2008

(54) METHOD FOR APPLYING A LAYER TO A HYDROPHOBIC SURFACE

(75) Inventors: David A. DeMuynck, Underhill, VT (US); John E. Dillon, Essex Junction, VT (US); Ross Duncan, S. Barlington, VT (US); Richard A. Phelps, Williamstown, VT (US); Kevin C. Remillard, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 11/161,214

(22) Filed: Jul. 27, 2005

(65) Prior Publication Data

US 2006/0003468 A1    Jan. 5, 2006

Related U.S. Application Data

(63) Continuation of application No. 10/709,654, filed on May 20, 2004, now abandoned.

(51) Int. Cl.
*H01L 21/31* (2006.01)
*H01L 21/469* (2006.01)

(52) U.S. Cl. .............. 438/758; 438/761; 438/763; 438/782; 257/E21.24

(58) Field of Classification Search ................ 438/758, 438/761, 763, 782, 906
See application file for complete search history.

(56) References Cited

U.S. PATENT DOCUMENTS

| | | | |
|---|---|---|---|
| 5,516,886 A | | 5/1996 | Rahman et al. |
| 5,529,888 A | * | 6/1996 | Watanabe et al. ........... 430/331 |
| 5,624,789 A | | 4/1997 | Rahman et al. |
| 5,744,537 A | | 4/1998 | Brunsvold et al. |
| 5,830,623 A | * | 11/1998 | Maruyama et al. ......... 430/322 |
| 5,830,990 A | | 11/1998 | Rahman |
| 6,057,080 A | | 5/2000 | Brunsvold et al. |
| 6,399,481 B1 | * | 6/2002 | Yamada ....................... 438/636 |
| 6,727,047 B2 | * | 4/2004 | Montgomery et al. ...... 430/322 |
| 7,196,770 B2 | * | 3/2007 | Baselmans et al. ........... 355/53 |
| 2002/0071995 A1 | * | 6/2002 | Montgomery et al. ......... 430/5 |

FOREIGN PATENT DOCUMENTS

JP         63001430 A   *  1/1988

* cited by examiner

*Primary Examiner*—Michael S. Lebentritt
*Assistant Examiner*—Angel Roman
(74) *Attorney, Agent, or Firm*—Schmeiser, Olsen & Watts; Richard M. Kotulak

(57) ABSTRACT

A method of forming a coating. The method includes: providing a substrate having a surface; forming a layer of water on the surface; and forming a layer of a material on the layer of water.

32 Claims, 8 Drawing Sheets

METHOD FOR APPLYING A LAYER TO A HYDROPHOBIC SURFACE

RELATED APPLICATION

The present invention claims priority to and is a continuation-in-part of copending U.S. patent application Ser. No. 10/709,654, filed May 20, 2004 and entitled "Method For Applying A Layer To A Hydrophobic Surface."

FIELD OF THE INVENTION

The present invention relates to the field of applying layers of material to hydrophobic surfaces; more specifically, it relates to method for reducing the quantity of the material applied to a substrate having a hydrophobic surface in order to form a uniform layer of the material on the hydrophobic surface.

BACKGROUND OF THE INVENTION

There are many aqueous based materials that must be applied to surfaces that are hydrophobic or water repelling surfaces. In order to form a uniform coating, especially by spinning or spin coating, an excess of the aqueous based material must be applied, and the excess then removed and discarded. Since in many applications, for example, in the application of a top anti-reflective coating (TARC) to a photoresist layer formed on a semiconductor substrate or wafer, the amount of discarded material is very many times the amount of material in the finished coating and thus the wastage and resultant cost is very high. Therefore, there is a need for a method to reduce the amount of material required to form a uniform layer on a hydrophobic surface.

SUMMARY OF THE INVENTION

A first aspect of the present invention is a method, comprising: providing a substrate having surface; forming a layer of water on the surface; and forming a layer of a material on the layer of water.

A second aspect of the present invention is a method, comprising: forming a photoresist layer on a substrate; forming a layer of water on the top surface of the photoresist layer; and forming a layer of anti-reflective material on the layer of water to form an anti-reflective coating on the photoresist layer.

A third aspect of the present invention is a method, comprising: forming the layer of photoresist on a semiconductor substrate; forming a layer of water of substantially uniform thickness on the top surface of the photoresist layer; and forming a layer of anti-reflective material on the layer of water to form an anti-reflective coating on the surface.

A fourth aspect of the present invention is An apparatus, comprising: a chuck having a top surface and rotatable about a axis perpendicular to the top surface and passing through a center point of the top surface; and first and second hollow dispense nozzles having respective fist and second bores, the first and second hollow dispense nozzles mounted on a application head disposed above the top surface of the chuck, the application head moveable in a direction parallel to the top surface of the chuck, the first dispense nozzle alignable over the center point when the application head is in a first position and the second dispense nozzle alignable over the center point when the application head is in a second position, at least a portion of the bore of second dispense tube having a maximum cross-sectional dimension of between about 0.5 millimeters and about 2.0 millimeters.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

For the purposes of the present invention the terms layer and coating may be used interchangeably. A substrate may have any shape, including square, round, rectangular or irregular. Substrate may comprise almost any material, including but not limited to metal, plastic and glass. A wafer is a substrate having the geometry of a thin disk. When preferenced by the word "semiconductor" the terms substrate and wafer imply the wafer or substrate comprises semiconductor materials such as silicon and/or germanium including bulk silicon wafers and silicon-on-oxide (SOI) wafers. Unless otherwise noted, the water used describing in the present invention is de-ionized (DI) water having resistivity of about $10^{18}$ megohms or higher to avoid ionic and particulate contamination of the wafer. Any other purified water, such as distilled or water produced by reverse osmosis may be used. Where ionic contamination is not a concern, substantial amount of impurities may be present provided they do not adversely effect the operation of the present invention. The terms resist and photoresist are used interchangably.

The present invention will be primarily described in the context of the semiconductor industry in general and in application of TARCs to photoresist layers in particular but is applicable to any product or process requiring coating a hydrophobic surface. An anti-reflective layer suppresses thin film interference effects by reducing the amount of energy reflected back into the photoresist layer from the photoresist/ anti-reflective coating interface. Both the index of refraction and thickness of the anti-reflective layer are critical parameters in achieving optimal thin film interference suppression. A TARC is therefore an antireflective coating applied to the top surface of the photoresist layer. Examples of photoresist materials are given in TABLE I and of TARC materials in TABLE II, but the invention should not be construed as limited to the particular photoresist or TARC materials listed in TABLES I and II.

The application of the present invention to the semiconductor industry should thus be considered as a primary example of the problem of coating hydrophobic surfaces.

Figure 1A:
FIGS. 1A through 1D are partial cross-sectional drawing illustrating application of the present invention to a photolithographic process according to the present invention.
Figure 1B:
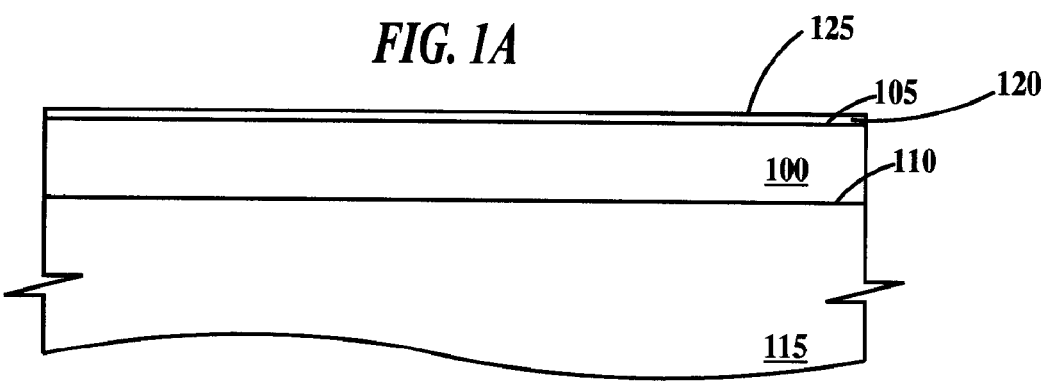
Figure 1C:
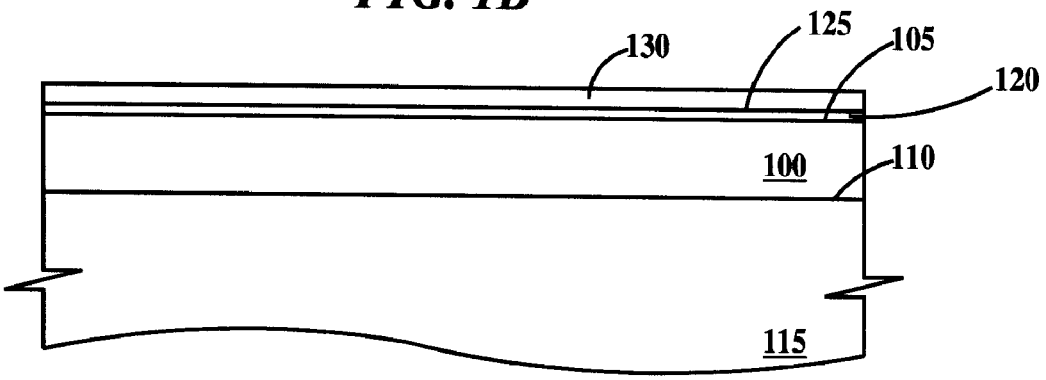
Figure 1D:
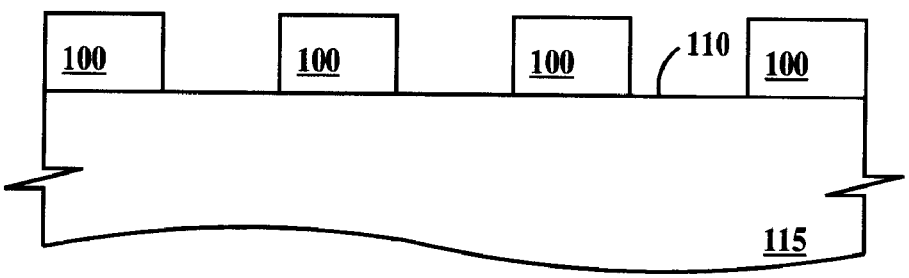

FIGS. 1A through 1D are partial cross-sectional drawing illustrating application of the present invention to a photolithographic process according to the present invention. In FIG. 1A, a photoresist layer 100 having a top surface 105 has been formed on the top surface 110 of a substrate 115. Top surface 105 is a hydrophobic surface, which is not unexpected based on the chemical composition of modern photoresists (see TABLE I infra) since most photoresists are solvent based hydrophobic monomers, polymers or resins. The degree of hydophobicity of a surface is measured by its water contact angle. Water contact angle is discussed infra more fully in reference to FIG. 2B. In FIG. 1B a water layer 120 having a top surface 125 has been formed on top surface 110 of photoresist later 115. In step 1C, a TARC layer 130 has been formed on top surface 125 of water layer 120. It is possible, in light of the chemical composition of TARC layer 130, being a small amount of water soluble polymer dissolved in water (see TABLE II infra), that water layer 120 is absorbed into TARC layer 130 although the water layer and TARC layer are shown as separate in FIG. 1C. The lifetime of water layer 120 is very short under normal clean room conditions of about 20° C. and about 38% to 40% relative humidity, being about less than a few seconds, so TARC layer 130 must be formed within a limited amount of time after formation of water layer 120. In FIG. 1D, photoresist layer 100 has been patterned by exposure to ultraviolet light and developed thus exposing top surface 110 of substrate 115 where the photoresist layer has been developed away. The developing process removes TARC layer 130 and water layer 120.

TABLE I is a list of exemplary photoresist materials suitable for use in the present invention when applied to semiconductor fabrication. Mid-ultraviolet (MUV) indicates a photoresist suitable for exposure at mid-ultraviolet wavelengths of light of about 365 nm. Deep-ultraviolet (DUV) indicates a photoresist suitable for exposure at deep-ultraviolet wavelengths of light of about 248 nm or less. Other photoresists may be used as well.

TABLE I

| TYPE | MANUFACTURER | NAME | COMPOSITION |
| --- | --- | --- | --- |
| MUV | TOK OHKA KOGYO CO., LTD Kawasaki City, Japan | TSMR-iN011 PM TSMR-iN027 PM | Propylene glycol monomethyl ether acetate (60-95%) Polyhydroxy styrene type resin (5-35%) Photoacid generator (<5%) Crosslinking agent (<5%) |
| | | THMR-iP3250 LB | Ethyl lactate (61-79%) n-Butyl acetate (6-9%) Novolac resin (10-25%) Photoactive compound (2-8%) |
| | Sumitomo Chemical Co., LTD Osaka, Japan | Sumiresist PFI-58 | Methyl amyl ketone(2-Heptanone) (63-88%) Novolac resin (8-25%) Photoactive compound (4-12%) |
| DUV | JSR Microelectronics Inc. Tokyo, Japan | JSR ARF AR 237J | Poly(meth)acrylate (5-25%) Alicyclic carboxylic ester (0-5%) Photoacid generator (0.1-3%) Propylene glycol monomethyl ether acetate (60-95%) Gamma-Butyrolactone (0-10%) |
| | | JSR ARF AR 1570J | Poly(meth)acrylate (5-25%) Alicyclic carboxylic ester (0-10%) Photoacid generator (0.1-3%) Propylene glycol monomethyl ether acetate (75-85%) Gamma-Butyrolactone (0-10%) |
| | | JSR KRF M20G | Polyhydroxy styrene derivative (10-30%) Iodonium salt compound (0.1-1%) Ethyl lactate (50-70%) Ethyl 3-ethoxypropionate (20-30%) |
| | Rohm and Haas Electronic Materials LLC Marlborough, MA, USA | UV(TM) 110-0.4 | Ethyl lactate (>70%) Aromatic Sulfur Compound (<2%) Aromatic Acrylic Polymer (<30%) Nonionic surfactant (<1%) |
| | | UVII(TM) HS-0.8 | Ethyl lactate (75-88%) Acrylic Copolymer (10-20%) Organic Siloxane Surfactant (0-1%) Aromatic Sulfur Compound (0.1-1%) |

TABLE II is a list of exemplary TARC materials suitable for use in the present invention when applied to semiconductor fabrication. MUV indicates a TARC suitable for coating a photoresist exposed with mid-ultraviolet wavelength light. DUV indicates a TARC suitable for coating a photoresist exposed with deep-ultraviolet wavelength light. Other TARC materials may be used as well.

TABLE II

| TYPE | MANUFACTURER | NAME | COMPOSITION |
|---|---|---|---|
| MUV | Clariant Corporation Somerville, NJ, USA | AZ Aquatar | Fluoroalkyl acid ammonium salt (3%) 2-propenoic acid homopolymer (1.5%) Water (95.5%) |
| DUV | JSR Microelectronics Inc. Tokyo, Japan | JSR NFC 540 | Fluoro acrylic polymer (1-10%) Anionic surfactant (0.1-1%) Water (90-99%) |

As may be seen in Table II from the composition of AZ Aquatar be about 95.5% and JSR NFC 540 being about 90-99% water, TARC materials comprise substantial amounts of water.

Figure 2A:
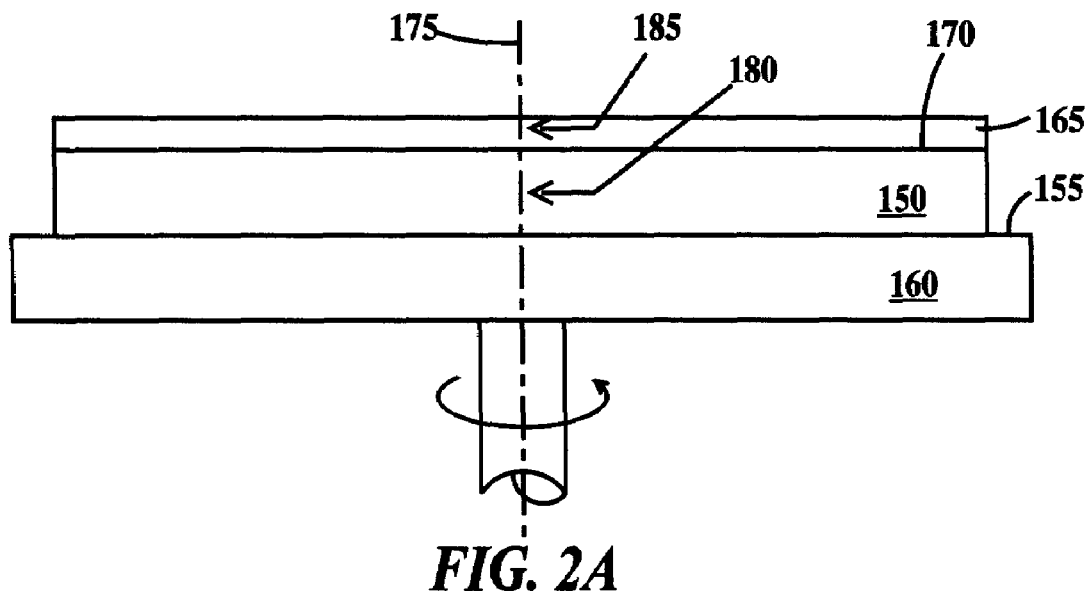
FIGS. 2A through 2D are schematic diagrams illustrating a method of forming a uniform layer on a hydrophobic surface according to the present invention.

FIGS. 2A through 2D are schematic diagrams illustrating a method of forming a uniform layer on a hydrophobic surface according to the present invention. In FIG. 2A, a semiconductor wafer 150 is positioned on top surface 155 of a wafer chuck 160. Semiconductor wafer 150 has, for example, a diameter of 100, 125, 200 or 300 mm. A layer of photoresist 165 has been formed on a top surface 170 of semiconductor wafer 150. Wafer chuck 160 is rotatable about an axis 175 that is ideally perpendicular to top surface 155 of wafer chuck 160. Ideally axis 175 also passes through the geometric center 180 of wafer chuck 160 and the geometric center 185 of semiconductor wafer.

Figure 2B:
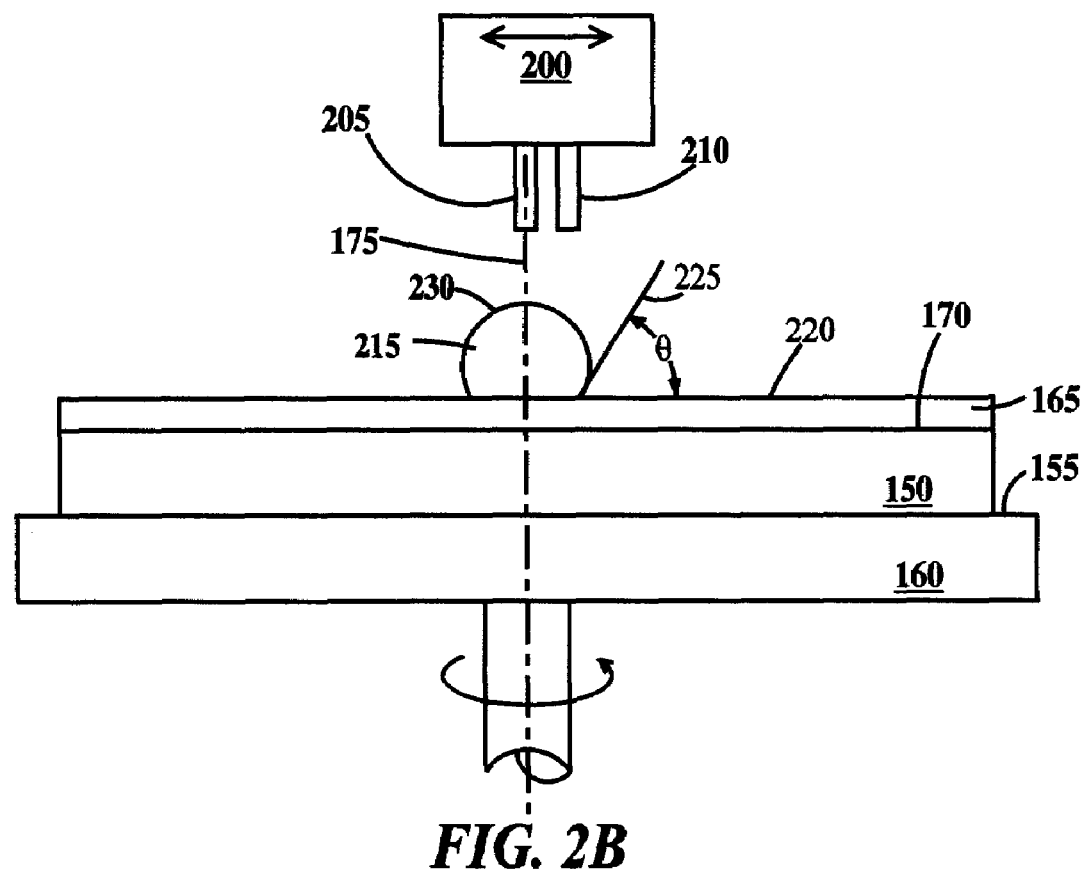

In FIG. 2B, an application head 200 has a first nozzle 205 for applying water and a second nozzle 210 for applying TARC. Application head 200 can move laterally in order to align either first nozzle 205 or second nozzle 210 with axis 175 so the material dispensed from the nozzles is ideally dispensed in the center of wafer 150. In FIG. 2B, first nozzle 205 is aligned with axis 175 and a predetermined amount of water sufficient to form a globule of water 215 on a top surface 220 of photoresist layer 165 is dispensed. Since top surface 220 of photoresist layer may not be level (as measured by a spirit level for example) and nozzle 205 may not be exactly centered on axis 175, wafer chuck 160 is rotated at a predetermined speed before and during the water dispense cycle. In one example, wafer chuck is rotated from about 5 to 50 rpm and about 2 to 20 ml of water are dispensed at a rate of about 0.5 to 3.0 ml/sec. The exact amount of water dispensed must not exceed an amount that would cause water globule 215 to collapse and not be less than an amount that will not subsequently spread evenly over the entire top surface 220 of photoresist layer 165. The exact speed of rotation of wafer chuck 160 must not exceed a speed of rotation that would cause globule of water 215 to break apart.

It will be seen that globule of water 215 contacts top surface 220 of photoresist layer along a line 225 tangent to the surface 230 of the globule of water. A water contact angle θ, is thus defined as the angle between a plane tangent to surface 230 of water globule 215 and top surface 220 of photoresist layer 165, at any point along their line of contact. The higher the water contact angle, the less wettable (more hydrophobic) the surface. The photoresists in Table I when spin coated on a substrate have top surfaces having water contact angles in the range of about 40° to 60°.

The phenomenon of wetting (hydrophillicity) or non-wetting (hydophobicity) of a surface by a liquid (water) is measured by the liquid (water) contact angle. Contact angle measurement methods have been developed extensively over the past four decades and are well known in the art. A large body of reliable data and literature exists correlating contact angle data with the properties of surface tension.

Figure 2C:
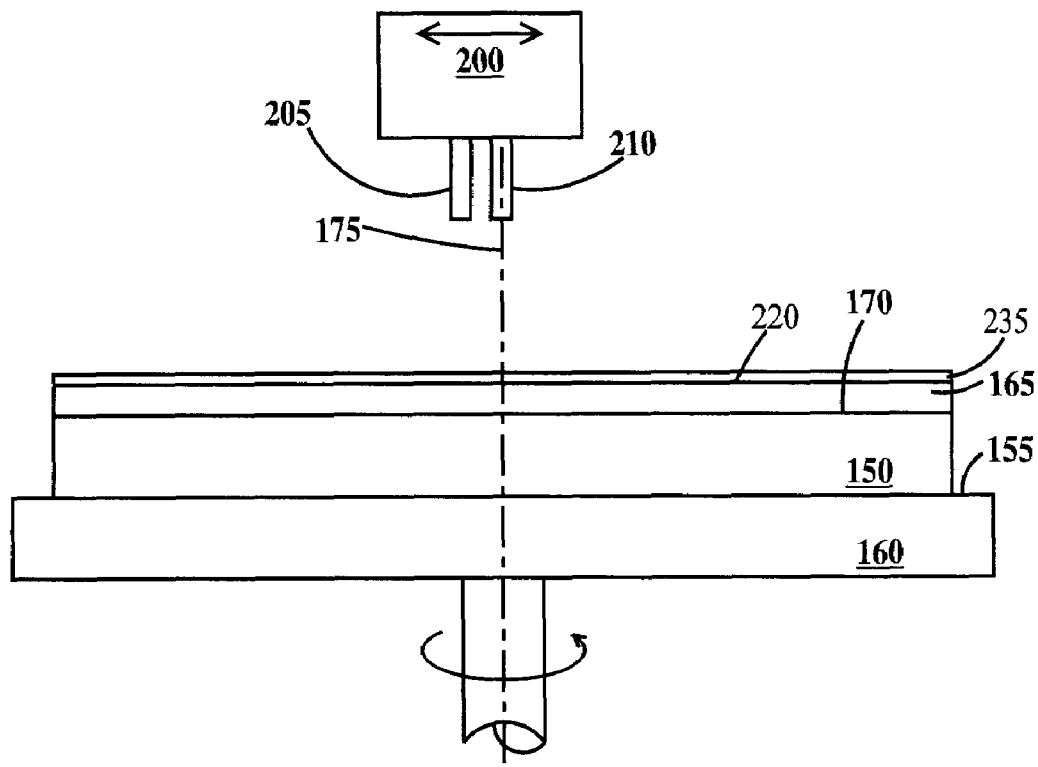

In FIG. 2C, a water layer 235 is formed on top surface 220 of photoresist layer 165 by ramping up rotation of wafer chuck 160 after the predetermined volume of water has been dispensed at a ramp rate of about 10,000 rpm/sec to a water spin off speed of about 500 to 2000 rpm and spinning for a spin off time of about 0.3 to 5.0 seconds. Simultaneously, second nozzle 210 of application head 200 is moved to align with axis 175. Water globule 215 (see FIG. 2B) is thus spread out to form water layer 235 and excess water spun off. Formation of water layer 235 is observable by formation of interference fringes during the spinning. Because water layer 235 will completely vaporize within a few seconds, it is difficult to determine the exact thickness of the water layer.

Figure 2D:
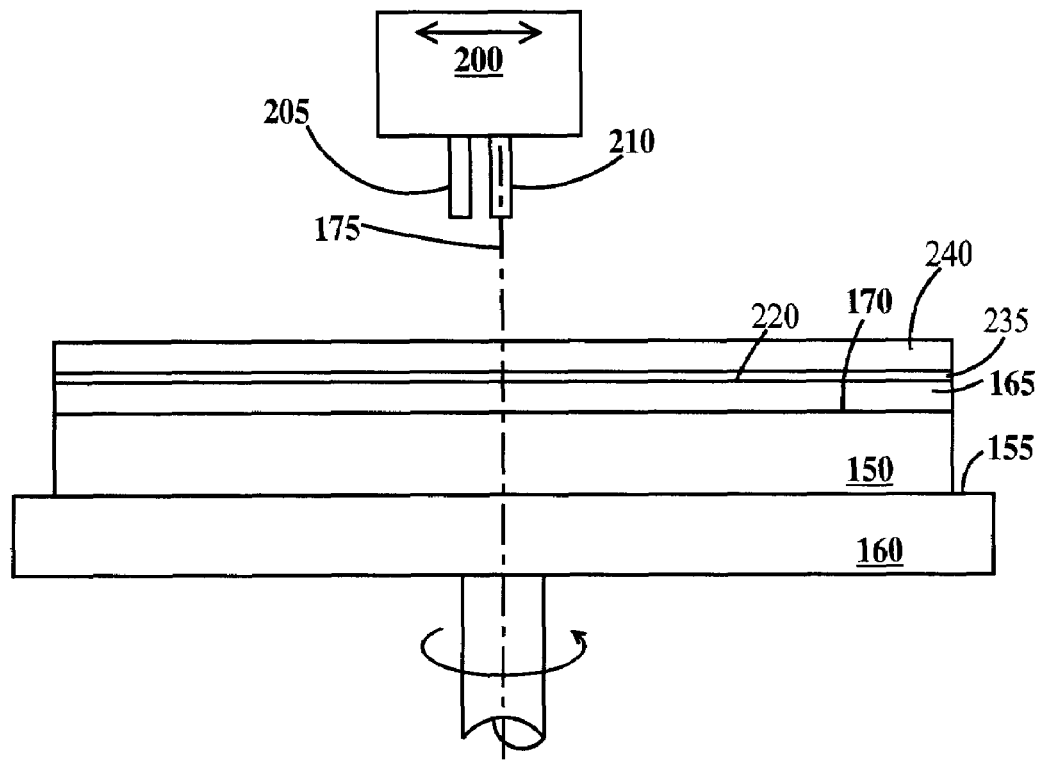

In FIG. 2D, a layer of TARC 240 is formed on a top surface 245 of water layer 235 by ramping up the rotation speed of wafer chuck 160 by about 10,000 rpm/sec from the spin-off speed to a TARC apply speed of about 2000-5,000 rpm within about 0 to 2 seconds of the spin off time for forming water layer 235 expiring, dispensing TARC at a rate of about 1.0 ml of TARC/sec for a predetermined amount of time (the time is a function of the total volume of TARC to be applied) and then ramping down the rotation speed of wafer chuck 160 by about −1,000 rpm/sec from the TARC apply speed to a casting speed of about 2,500 rpm and spinning at the casting speed for about 15 seconds.

Water layer 235 may be only one to several molecular layers thick (or may not even be a continuous layer). Water layer 235 may even be no more than a collection of water molecules temporarily bound to the surface molecules of photoresist layer 165. Water layer 235 may be immediately absorbed into TARC layer 240 as soon at the TARC layer forms. It has been experimentally determined that the amount of TARC dispensed and still have a TARC layer of fixed thickness and uniformity is reduced by the spin application of water before application of TARC. It is believed that this reduction in TARC dispense volume is possible because water layer 235 alters the surface tension characteristics of the photoresist/TARC system and allows better wetting of photoresist layer 165 by TARC layer 240.

Consider a drop of a liquid resting on a solid surface. The drop of liquid may be considered as resting in equilibrium by balance the three forces involved, namely, the interfacial tensions between solid and liquid, between solid and vapor and between liquid and vapor. The surface tension of the solid will favor spreading of the liquid, but this is opposed by the solid-liquid interfacial tension and the vector of the surface tension of the liquid in the plane of the solid surface. In the present invention, it is believed that the water layer increases the surface tension of the surface to be coated (photoresist surface), decreases the solid-liquid interfacial tension between the liquid (TARC) and surface being coated (photoresist surface), decreases the surface tension of the material being coated (TARC) or a combination of the forgoing effects.

The most important consideration for our purposes is that surface tension values are intimately related to the surface constitution. Even small changes in the outermost atomic layer of the photoresist are reflected in a change of surface tension and thus wettability (degree of hydrophillicity or hydophobicity) of the photoresist.

Figures 3, 4:
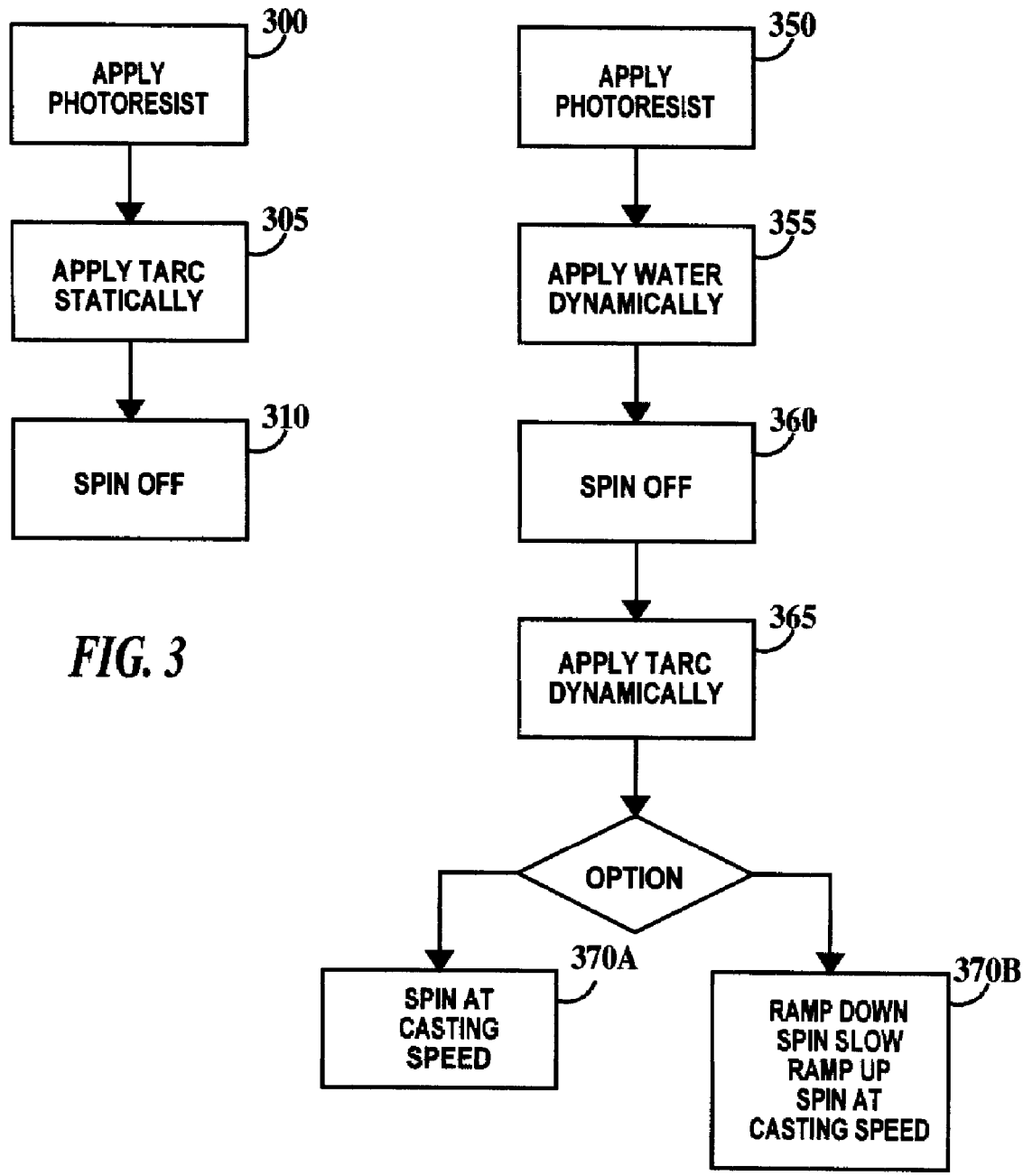
FIG. 3 is a flowchart of a method of applying a layer to a hydrophobic surface according to a control method.
FIG. 4 is a flowchart of a method of applying a layer to a hydrophobic surface according to the present invention.

In order to establish the reduction in volume of TARC required to coat a wafer to a fixed thickness and still have acceptable thickness uniformity across a wafer, from wafer to wafer and from tool to tool a set of experiments were performed against a control process. The control process and experimental process are illustrated in FIGS. 3 and 4 respectively and described infra. The photoresist and TARC materials were selected from TABLE I and TABLE II respectively. Wafers were 200 mm diameter semiconductor wafers.

FIG. 3 is a flowchart of a method of applying a layer to a hydrophobic surface according to a control method. In step 300, a layer of photoresist is applied. The photoresist layer is pre-baked to drive out excess solvent and cooled to room temperature. In step 305, a volume of TARC at about 1 ml/sec is applied at 0 rpm spin speed. The volume of TARC varies by experimental cell and is discussed infra. In a nominal case the volume of TARC dispensed is about 5 ml. Then, in step 310, the wafer is ramped up to a casting speed of about 2,500 rpm at a ramp rate of 1,000 rpm/sec and spun for about 15 seconds to spin off excess TARC. The wafer rotation is then stopped.

Figure 5:
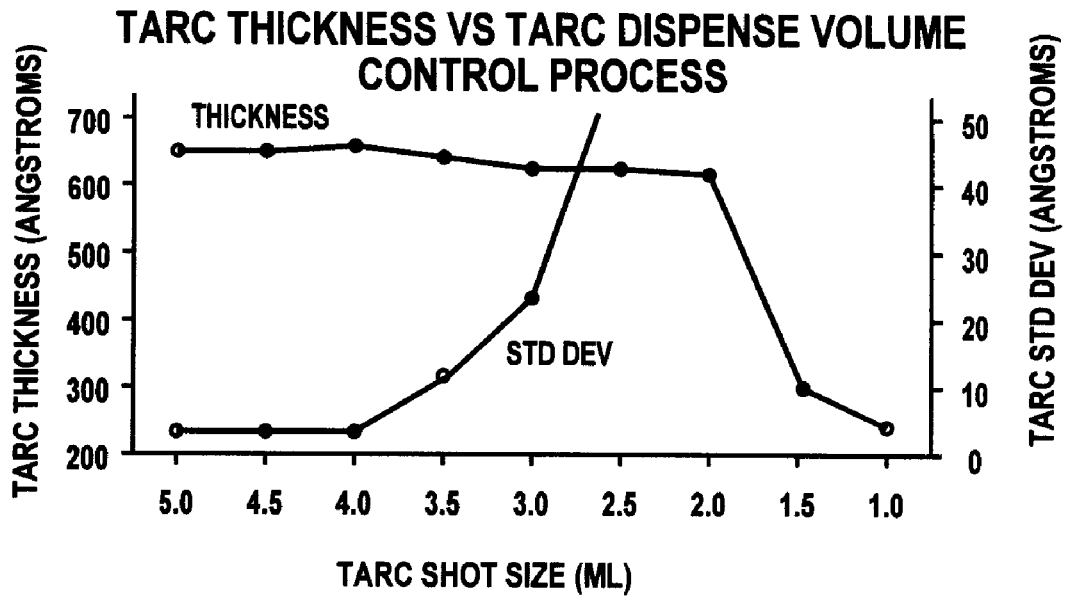
FIG. 5 is a chart illustrating thickness of a TARC layer applied to hydrophobic surface versus the volume of TARC used to form the layer according to the control method of FIG. 3.

FIG. 4 is a flowchart of a method of applying a layer to a hydrophobic surface according to the present invention. In step 350, a layer of photoresist is applied. The photoresist layer is pre-baked to drive out excess solvent and cooled to room temperature. In step 355, the wafer is rotated at about 15 rpm and about 10 ml of water is dispensed at a rate of about 0.65 ml/sec. In step, 360, as soon as the water dispense is completed, the wafer is ramped from about 15 rpm to about 1,000 rpm at a ramp rate of about 10,000 rpm/sec and spun for a total time of about 0.3 seconds. In step 365, the wafer is ramped from about 1,000 rpm to about 3,500 rpm at a ramp rate of about 10,000 rpm/sec and a volume of TARC at about 1 ml/sec is applied. The volume of TARC varies by experimental cell and is discussed infra. In a nominal case the volume of TARC dispensed is about 0.3 ml. There is now an option. The method can proceed to step 370A or 370B. In step 370A, the wafer rotation is ramped down to a casting speed of about 2,500 rpm at a rate of about −1,000 rpm/sec and allowed to spin for about 15 seconds. The wafer rotation is then stopped. In step 370B, The wafer rotation is ramped down to about 150 rpm at a ramp rate of about −50,000 rpm/sec and held at about 150 rpm for about 1 second. Then the wafer the wafer rotation is ramped up to a casting speed of about 2,500 rpm at a rate of about 1,000 rpm/sec and allowed to spin for about 15 seconds. The wafer rotation is then stopped FIG. 5 is a chart illustrating thickness of a TARC layer applied to hydrophobic surface versus the volume of TARC used to form the layer according to the control method of FIG. 3. In FIG. 5, the volume of TARC indicated was applied to several wafers using the control method illustrated in FIG. 3 and described supra. A TARC volume of 5 ml is the nominal volume. It is readily seen that a minimum volume of about 2 ml of TARC is required to obtain a thickness close to a target thickness of about 650 Å. However, at a volume of 2 ml of TARC, many area of de-wets (no TARC coverage) are seen so in reality a minimum of 3 ml of TARC is required for a de-wet free coating. Note, the standard deviation of the TARC thickness becomes unacceptable at volumes of about 4.0 ml or less.

Figure 6:
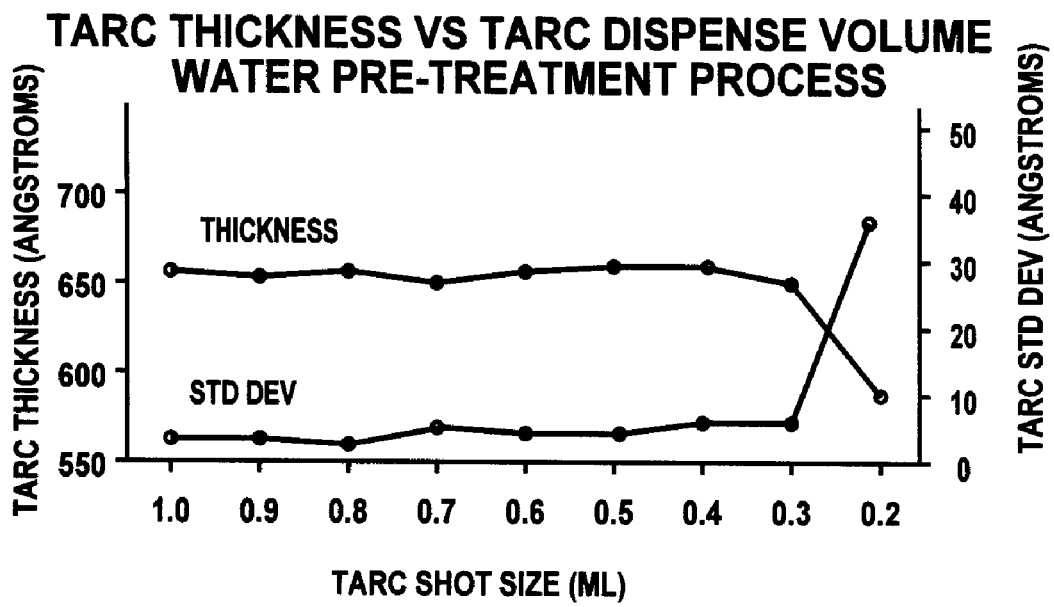
FIG. 6 is a chart illustrating thickness of a TARC layer applied to hydrophobic surface versus the volume of TARC used to form the layer according to the method of the present invention of FIG. 4.

FIG. 6 is a chart illustrating thickness of a TARC layer applied to hydrophobic surface versus the volume of TARC used to form the layer according to the method of the present invention of FIG. 4. The method of the present invention is referred to as the water pretreatment process on several occasions hereafter. In FIG. 6, the volume of TARC indicated was applied to several wafers using the method of the present invention illustrated in FIG. 4 and described supra. In FIG. 6, it is readily seen that a minimum volume of about 0.3 ml of TARC is required to obtain a thickness close to a target thickness of about 650 Å. In other studies a minimum volume of 0.15 ml of TARC was required to give a uniform thickness TARC layer. This is about 15% of the 2 ml minimum volume of TARC volume required for the control method and about 6% of the 5 ml nominal volume of TARC used in the control method. Note, the standard deviation of the TARC thickness remained acceptable down to a TARC dispense volume of about 0.3 ml in this study. In other studies the TARC dispense volume was about 0.15 ml.

Figure 7:
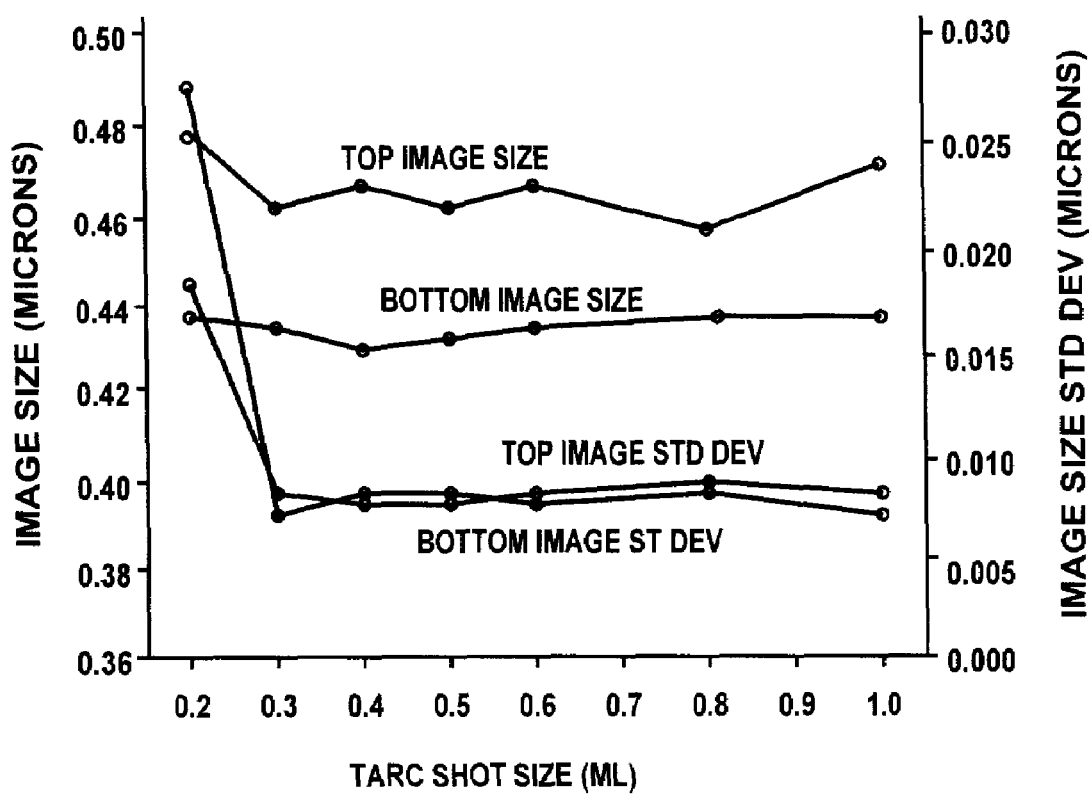
FIG. 7 is a chart, illustrating image size control versus the volume of TARC applied according to the method of the present invention.

FIG. 7 is a chart, illustrating image size control versus the volume of TARC applied according to the method of the present invention. In FIG. 7, both the top of a resist image and a bottom of the resist image at several positions on a wafer (several wafers per dispense volume) are plotted as well as the standard deviation of the measured linewidths. It can be readily seen that top and bottom image size remain nearly constant and the uniformity remains consistent with TARC dispense volumes as low as 0.3 ml. In other studies image size uniformity was obtained with a TARC dispense volume of 0.15 ml. Note, image sizes were measured on a commercially available critical dimension scanning electron microscopes (CD SEM) with edge detection/measurement software.

Figure 8:
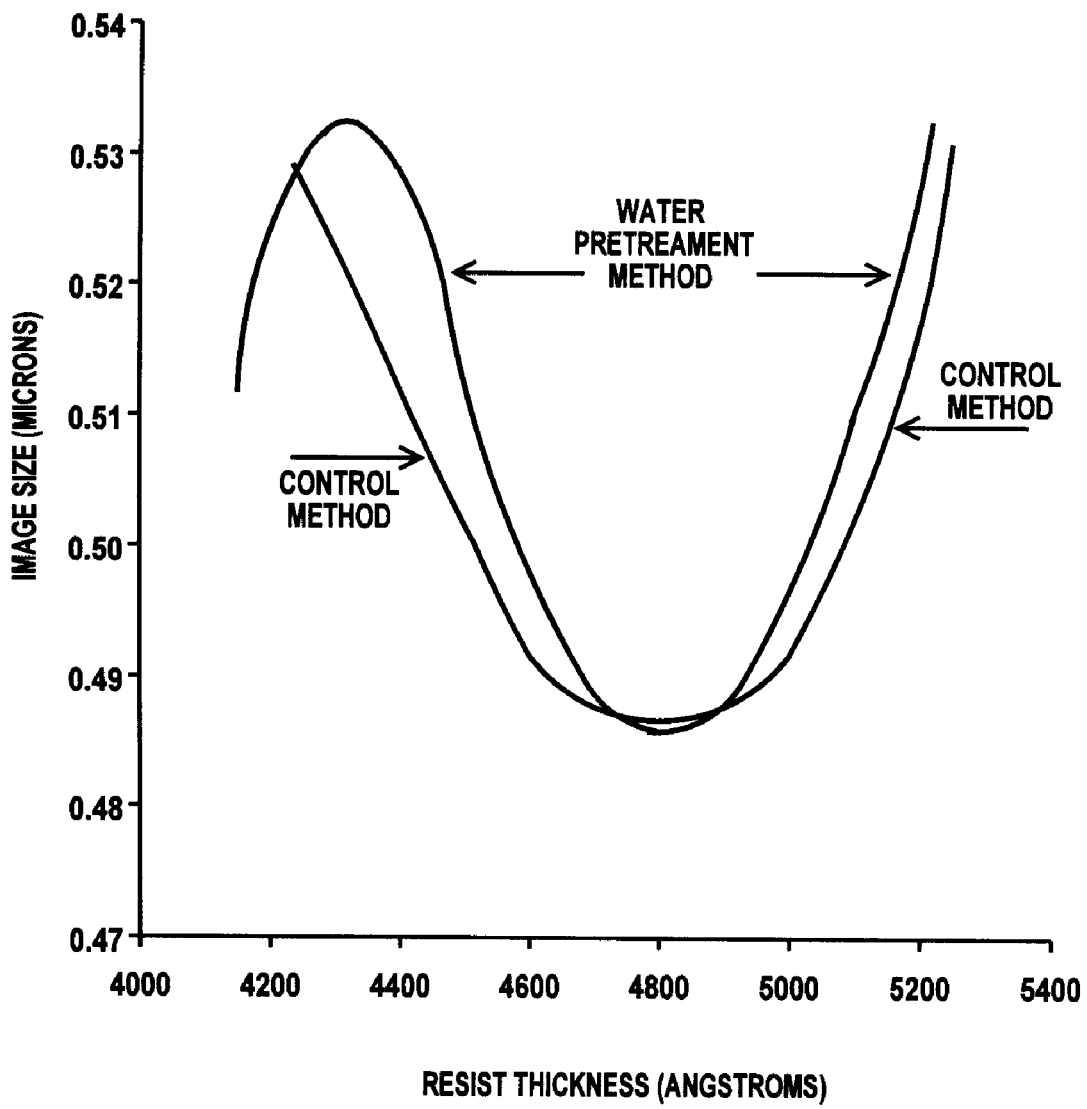
FIG. 8 is a chart comparing the control method and the method of the present invention to of resist thickness versus the size of subsequently printed and developed images.

FIG. 8 is a chart comparing the control method and the method of the present invention to resist thickness versus the size of subsequently printed and developed images. In FIG. 8, image size versus resist thickness is plotted for nominal control process of FIG. 3 (using a TARC dispense volume about 5 ml) and for the method of the present invention (TARC dispense volume about 0.5 ml) at a constant exposure energy. The chart of FIG. 8 shows that the method of the present invention did not significantly, if at all, alter the anti-reflective properties (i.e. index of refraction or TARC thickness) as there is little difference between the amplitudes of the control method and the water pre-treatment method. In addition there is very little difference in resist thickness.

It is possible for tool type and tool-to-tool differences of the water and TARC apply tool to affect the accuracy and repeatability of a process. TABLE III lists experimental measurements of TARC thickness and thickness standard deviation for the control process of FIG. 3 using techniques of a TARC dispense volume of 5 ml and the water pretreatment method of FIG. 4 using a TARC dispense volume of 0.5 ml, both techniques using TARC material AZ Aquatar (see TABLE II supra) various tools.

TABLE III

| Tool | Control Mean Thickness (Å) | Control Wafer to Wafer Std Dev (Å) | Control within Wafer Std Dev (Å) | Water Pretreatment Mean Thickness (Å) | Water Pretreatment Wafer to Wafer Std Dev (Å) | Water Pretreatment within Wafer Std Dev (Å) |
|---|---|---|---|---|---|---|
| A | 669 | 14.5 | 3.0 | 648 | 5.2 | 3.4 |
| B | 653 | 13.0 | 3.2 | 655 | 8.6 | 4.0 |
| C | 660 | 4.4 | 2.4 | 644 | 5.5 | 3.3 |
| D | 663 | 11.3 | 2.7 | 667 | 5.5 | 3.1 |
| E | 665 | 12.5 | 4.8 | 668 | 9.6 | 3.9 |

The data in TABLE III indicates that there is essentially no difference in TARC thickness or with wafer standard deviation between the control method and the method of the present invention and that the wafer to wafer standard deviation of the method of the present invention is superior to the wafer to wafer standard deviation of the control process for AZ Aquatar.

TABLE IV lists experimental measurements of TARC thickness and thickness standard deviation for the control process of FIG. 3 using techniques of a TARC dispense volume of 5 ml and the water pretreatment method of FIG. 4 using a TARC dispense volume of 0.3 ml, both techniques using TARC material JSR NFC-540 (see TABLE II supra).

TABLE IV

| Tool | Control Mean Thickness (Å) | Control Wafer to Wafer Std Dev (Å) | Control within Wafer Std Dev (Å) | Water Pretreatment Mean Thickness (Å) | Water Pretreatment Wafer to Wafer Std Dev (Å) | Water Pretreatment within Wafer Std Dev (Å) |
|---|---|---|---|---|---|---|
| A | 335 | 12.2 | 4.9 | 336 | 5.0 | 2.5 |
| B | 335 | 10.1 | 4.7 | 335 | 6.5 | 2.9 |
| C | 335 | 7.9 | 6.8 | 336 | 5.9 | 2.6 |

The data in TABLE IV indicates that there is essentially no difference in TARC thickness between the control method and the method of the present invention and that the uniformity (as measured by wafer to wafer and within wafer standard deviation) of the method of the present invention is superior to the uniformity of the control process for JSR NFC-540.

Figure 9A:
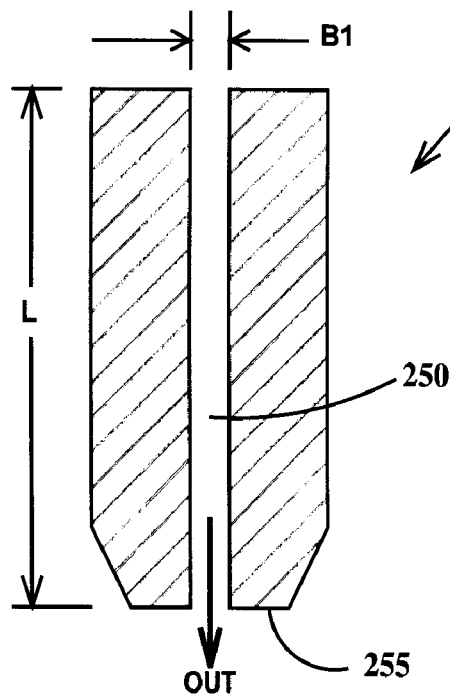
FIGS. 9A, 9B and 9C are cross-sectional views through a TARC dispense nozzle as illustrated in FIG. 2D.
Figure 9B:
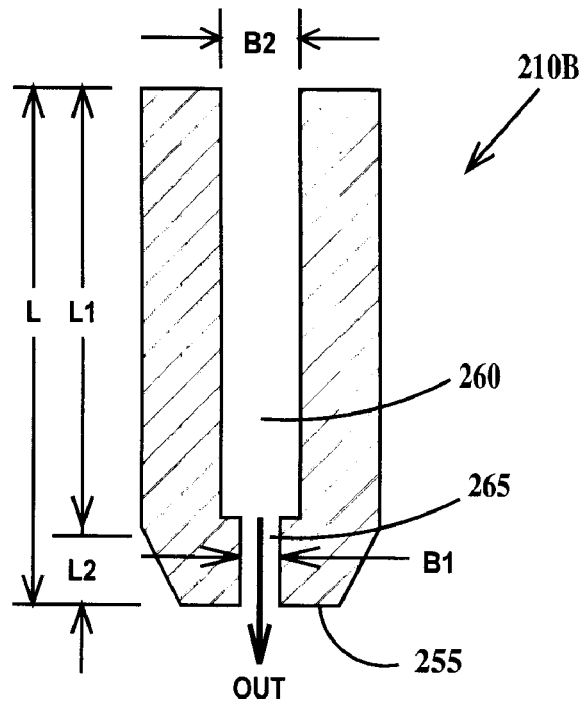
Figure 9C:
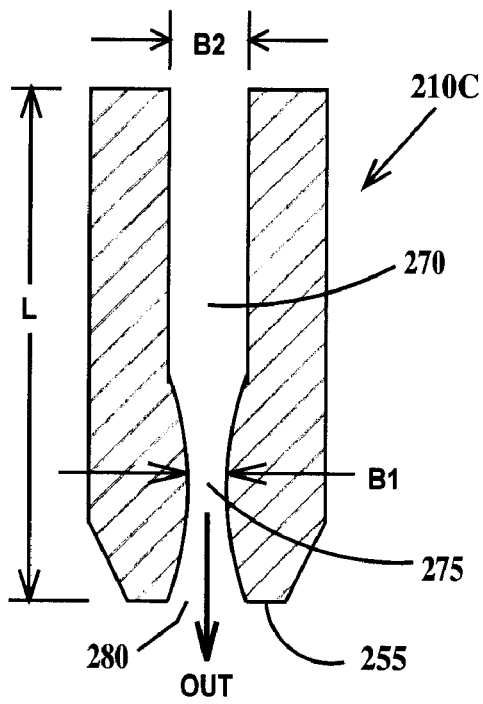

FIGS. 9A, 9B and 9C are cross-sectional views through a TARC dispense nozzle as illustrated in FIG. 2D. In FIG. 9A, a TARC dispense nozzle 210A has a length L and a uniform bore 250 having a maximum cross-sectional dimension of B1. TARC dispense nozzle 210A has a tip 255. In one example, bore 250 has a circular cross-section any place along length L. In one example B1 is between about 0.5 millimeters and about 2.0 millimeters. In FIG. 9B, a TARC dispense nozzle 210B has an over all length L and an upper bore 260 having a length L1 and a lower bore 265 having a length L2. Lower bore 265 is proximate to tip 255. Lower bore 265 has a maximum cross-sectional dimension of B1. Upper bore 260 has a maximum cross-sectional dimension of B2, where B2>B1. In one example, upper bore 260 and lower bore 265 each have a circular cross-section any place along respective lengths L2 and L1. In FIG. 9C, a TARC dispense nozzle 210C has over all length L and a bore 270 having a restriction 275 Bore 275 has a maximum cross-sectional dimension of B1. Restriction 275 has a maximum cross-sectional dimension of B2. In one example, bore 270 has a circular cross-section any place along lengths L. In one example, opening 280 in tip 255 has a maximum cross-section dimension between B1 and B2. In one example, opening 280 in tip 255 has a maximum cross-section dimension equal to or greater than B1. In one example, opening 280 in tip 255 has a maximum cross-section dimension equal to or greater than B2.

At maximum cross-section dimension B1 of the bore of the TARC application nozzle, the small quantities of TARC material described supra, can be dispensed at a slower rate. In one example, the TARC dispense rate is between about 0.1 milliliter per second to about 0.4 milliliter per second. These slow TARC dispense rates, provide time for the TARC to spread with a more uniform thickness over the surface of the photoresist layer without defects such as voids and streaks. TARC dispense rates between about 0.1 milliliter per second to about 0.4 milliliter per second reduce the acceleration and maximum spin speed required as well.

Thus, the present invention provides a method to reduce the amount of material required to form a uniform layer on a hydrophobic surface.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, small quantities of additives such as surfactants may be added to the water dispensed prior to TARC application. Therefore, it is intended that the following claims cover all such modifications and changes as fall within the true spirit and scope of the invention.

What is claimed is:

1. A method, comprising:
   forming a globule of water of fixed volume on a surface of a substrate only in a central region of said surface;

after forming said globule of water, spinning said substrate to form a layer of water on said surface from said globule of water, said layer of water entirely covering said surface of said substrate; and after forming said layer of water, forming a layer of a material on said layer of water said layer of material entirely covering said layer of water.

2. The method of claim 1, wherein said globule of water is formed while spinning said substrate.

3. The method of claim 1, wherein said forming said globule of water on said surface includes dispensing water on said surface while said substrate is spinning at a first speed and said spinning said substrate is at a second speed to form said layer of water, said second speed higher than said first speed.

4. The method of claim 3, wherein during said spinning at said first speed and said spinning at said second speed, said substrate is spinning about an axis substantially perpendicular to said surface and running through a center of said substrate.

5. The method of claim 1, wherein said layer of water is substantially uniform across said surface.

6. The method of claim 1, wherein said layer of water modifies the interfacial surface tension characteristics between said surface and said material in a manner to decrease the degree of hydophobicity of said surface.

7. The method of claim 1, wherein said forming said layer of said material on said layer of water includes spinning said substrate while dispersing said material on to said layer of water.

8. The method of claim 1, wherein said material as applied includes a substantial amount of water.

9. The method of claim 1, wherein forming said layer of said material on said layer of water includes dispensing said material onto said surface of said layer of water at a rate of about 0.4 milliliters per second or less.

10. A method, comprising:
forming a photoresist layer on a substrate;
forming a globule of water of fixed volume on a surface of a photoresist layer only in a central region of said photoresist layer;
after forming said globule of water, spinning said substrate to form a layer of water on said surface of said photoresist layer from said globule of water, said layer of water entirely covering said surface of said photoresist layer; and
after forming said layer of water, forming a layer of anti-reflective material on said layer of water, said layer of anti-reflective material entirely covering said surface of said photoresist layer.

11. The method of claim 10, wherein said layer of water wets said top surface of said photoresist layer with water and said forming said layer of anti-reflective material is performed while said top surface of said photoresist layer is still wet with water.

12. The method of claim 10, wherein said forming said globule of water includes dispensing water on said top surface of said photoresist layer while said substrate is spinning at a first speed and said spinning said substrate is at a second speed to form said layer of water, said second speed higher than said first speed.

13. The method of claim 12, wherein during said spinning at said low speed and said spinning at said high speed, said substrate is spinning about an axis substantially perpendicular to said surface and running through the center of said substrate.

14. The method of claim 10, wherein said forming said layer of anti-reflective material includes dispensing said anti-reflective material on said top surface of said photoresist layer while said substrate is spinning.

15. The method of claim 10, wherein said layer of water modifies the interfacial surface tension characteristics between said top surface of said photoresist layer and said anti-reflective material.

16. The method of claim 10, wherein said anti-reflective material as applied includes a substantial amount of water.

17. The method of claim 10, wherein a volume of anti-reflective material dispensed onto said top surface of said photo resist layer during said forming said layer of anti-reflective material is no more than a quarter of a volume of anti-reflective material that would otherwise be dispensed onto said top surface of said photo resist layer if said spinning said layer of water is not performed in order to produce essentially the same thickness of said anti-reflective coating.

18. The method of claim 10, wherein said forming said layer of anti-reflective material on said layer of water includes dispensing said anti-reflective material onto said surface said layer of water at a rate of about 0.4 milliliters per second or less.

19. A method, comprising:
forming a layer of photoresist on a semiconductor substrate;
forming a globule of water of fixed volume on a surface of said photoresist layer only in a central region of said photoresist layer;
after forming said globule of water, spinning said substrate to form a layer of water of substantially uniform thickness on said surface of said photoresist layer from said globule of water, said layer of water entirely covering said surface of said photoresist layer; and
after forming said layer of water, forming a layer of anti-reflective material on said layer of water, said layer of anti-reflective material entirely covering said surface of said photoresist layer.

20. The method of claim 19, wherein said layer of water wets said top surface of said photoresist layer with water and said forming said layer of anti-reflective material is performed while said top surface of said photoresist layer is still wet with water.

21. The method of claim 19, wherein said globule of water is formed while said semiconductor substrate is spinning at about 5 to 50 rpm.

22. The method of claim 19, wherein about 2 to 20 milliliters of water are dispensed to form said globule of water and said spinning said semiconductor substrate is performed at about 500 to 2000 rpm for about 0.3 to 5.0 seconds.

23. The method of claim 19, wherein about 2 to 20 milliliters of water are dispensed on said top surface of said photoresist layer while said semiconductor substrate is spinning at about 5 to 50 rpm to form said globule of water and said spinning said semiconductor substrate is performed at about 500 to 2000 rpm.

24. The method of claim 19, wherein said forming said layer of anti-reflective material includes dispensing said anti-reflective material on said top surface of said photoresist layer within about 0 to 5 seconds of the completion of said forming said layer of water.

25. The method of claim 19, wherein said forming said layer of anti-reflective material includes dispensing said anti-reflective material on said top surface of said photoresist layer while said semiconductor substrate is spinning at about 2000 to 5000 rpm.

26. The method of claim 19, wherein said water layer modifies the interfacial surface tension characteristics between said top surface of said photoresist layer and said anti-reflective material in a manner to decrease the degree of hydophobicity of said top surface of said photoresist layer.

27. The method of claim 19, wherein said anti-reflective material as applied includes a substantial amount of water.

28. The method of claim 19, wherein a volume of anti-reflective material dispensed onto said top surface of said photo resist layer during said forming said layer of anti-reflective material is less than about 4 milliliters.

29. The method of claim 19, wherein a volume of anti-reflective material dispensed onto said top surface of said photo resist layer during said forming said layer of anti-reflective material is between about 2 milliliters and 0.15 milliliters.

30. The method of claim 19, wherein said semiconductor substrate has a diameter selected from the group of diameters consisting of a 100 millimeter diameter, a 125 millimeter diameter, a 200 millimeter diameter and a 300 millimeter diameter.

31. The method of claim 19 further including:
exposing said photoresist layer to light and developing the exposed photoresist layer in order to form photoresist images on said semiconductor substrate.

32. The method of claim 19, wherein said forming said layer of anti-reflective material on said layer of water includes dispensing said material onto said surface said layer of water at a rate of about 0.4 milliliters per second or less.

* * * * *